United States Patent
Koestler

(10) Patent No.: US 11,640,998 B2
(45) Date of Patent: *May 2, 2023

(54) MULTI-JUNCTION SOLAR CELL WITH BACK-CONTACTED FRONT SIDE

(71) Applicant: AZUR SPACE Solar Power GmbH, Heilbronn (DE)

(72) Inventor: Wolfgang Koestler, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/007,781

(22) Filed: Aug. 31, 2020

(65) Prior Publication Data

US 2021/0066519 A1 Mar. 4, 2021

(30) Foreign Application Priority Data

Aug. 29, 2019 (DE) ...................... 10 2019 006 091.1

(51) Int. Cl.
*H01L 31/0224* (2006.01)
*H01L 31/0352* (2006.01)
(Continued)

(52) U.S. Cl.
CPC ............ *H01L 31/02245* (2013.01); *H01L 31/035281* (2013.01); *H01L 31/02167* (2013.01);
(Continued)

(58) Field of Classification Search
CPC ....... H01L 31/02245; H01L 31/035281; H01L 31/02167; H01L 31/0336; H01L 31/0687; H01L 31/078
See application file for complete search history.

(56) References Cited

U.S. PATENT DOCUMENTS 5,425,816 A 6/1995 Cavicchi et al.
5,716,459 A * 2/1998 Chang ............ H01L 31/035272
136/249

(Continued)

FOREIGN PATENT DOCUMENTS

EP 0528311 A2 2/1993
EP 1953828 A1 8/2008
(Continued)

OTHER PUBLICATIONS

Tauke-Pedretti Anna et al: "Resistance Considerations for Stacked Small Multi-Junction Photovoltaic Cells", 2013 IEEE 39th Photovoltaic Specialists Conference (PVSC), IEEE, Jun. 16, 2013, pp. 2131-2135, XP032568391, DOI: 10.1109/PVSC.2013.6744895.

(Continued)

*Primary Examiner* — Tamir Ayad
(74) *Attorney, Agent, or Firm* — Muncy, Geissler, Olds & Lowe, P.C.

(57) ABSTRACT

A stacked multi-junction solar cell with a back-contacted front side, having a germanium substrate that forms a rear side of the multi-junction solar cell, a germanium sub-cell and at least two III-V sub-cells, successively in the named order, and at least one passage contact opening that extends from the front side of the multi-junction solar cell through the sub-cells to the rear side and a metallic connection contact that is guided through the passage contact opening. A diameter of the passage contact opening decreases in steps from the front side to the rear side of the multi-junction solar cell. The front side of the germanium sub-cell forms a first step having a first tread depth that circumferentially projects into the passage contact opening. The second step with a second tread depth circumferentially projects into the passage contact opening.

19 Claims, 2 Drawing Sheets

(51) Int. Cl.
*H01L 31/0216* (2014.01)
*H01L 31/0336* (2006.01)
*H01L 31/0687* (2012.01)
*H01L 31/078* (2012.01)

(52) U.S. Cl.
CPC ...... *H01L 31/0336* (2013.01); *H01L 31/0687* (2013.01); *H01L 31/078* (2013.01)

(56) References Cited

U.S. PATENT DOCUMENTS

| | | | |
|---|---|---|---|
| 7,732,706 B1* | 6/2010 | Mardesich | H01L 31/0475 136/261 |
| 8,993,873 B2 | 3/2015 | Youtsey et al. | |
| 9,018,094 B2* | 4/2015 | Kosenko | H01L 23/481 438/668 |
| 9,680,035 B1 | 6/2017 | Chary et al. | |
| 10,263,134 B1* | 4/2019 | Derkacs | H01L 31/0725 |
| 2003/0140962 A1* | 7/2003 | Sharps | H01L 31/0687 136/249 |
| 2008/0185038 A1 | 8/2008 | Sharps | |
| 2011/0232733 A1* | 9/2011 | Noemayr | H01L 31/048 136/255 |
| 2013/0285251 A1* | 10/2013 | LaCroix | H01L 21/768 257/774 |
| 2017/0213922 A1 | 7/2017 | Lucow et al. | |
| 2017/0345955 A1 | 11/2017 | Chary et al. | |
| 2018/0294372 A1 | 10/2018 | Youtsey et al. | |

FOREIGN PATENT DOCUMENTS

| | | |
|---|---|---|
| RU | 2234166 C1 | 8/2004 |
| WO | WO2015/032241 A1 | 3/2015 |
| WO | WO2015138764 A1 | 9/2015 |

OTHER PUBLICATIONS

De Lafontaine, Mathieu et al. "Via sidewall insulation for through cell via contacts", AIP Conference Proceedings, Bd. 1881, Sep. 6, 2017, pp. 040002-1-040002-6, XP055579508, New York, US, ISSN: 0094-243X.

De Lafontaine, Mathieu et al: "Influence of plasma process on III-V/Ge multijunction solar cell via etching", Solar Energy Materials and Solar Cells, Bd. 195, Mar. 4, 2019, pp. 49-54, XP085651399, ISSN: 0927-0248.

De Lafontaine, Mathieu et al: "Anisotropic and Low Damage III-V/Ge Heterostructures Via Etching for Multijunction Photovoltaic Cell Fabrication", Plasma Etch and Strip in Microelectronics (PESM), 10$^{th}$ International Workshop, Leuven, Belgium, Oct. 19-20, 2017.

Dissertation Florian Clement; "Die Metal Wrap Through Solarzelle—Entwicklung und Charakterisierung" (2009).

Oliva E et al, "III-V Multi-Junction Metal Wrap Through (MWT) Concentrator Solar Cells" Presented at the 32$^{nd}$ European PV Solar Energy Conference and Exhibition, Jun. 20-24, 2016, Munich, Germany.

De Lafontaine M. et al: "III-V/Ge multijunction solar cell with Through Cell Vias Contacts fabrication", 65th International AVS Symposium & Topical Conferences, 23. Oct. 2018, pp. 1-2, XP055752225.

Colin C et al: "The handling of thin substrates and its potential for new~architectures in multi-junction solar cells technology", AIP Conference Proceedings, vol. 1881, 040001, pp. 1-7, 6. Sep. 2017,XP055724142.

\* cited by examiner

MULTI-JUNCTION SOLAR CELL WITH BACK-CONTACTED FRONT SIDE

This nonprovisional application claims priority under 35 U.S.C. § 119(a) to German Patent Application No. 10 2019 006 091.1, which was filed in Germany on Aug. 29, 2019, and which is herein incorporated by reference.

BACKGROUND OF THE INVENTION

Field of the Invention

The present invention relates to a stacked multi-junction solar cell with a back-contacted front side.

Description of the Background Art

To reduce the shading of the front side of a solar cell, it is possible to arrange both the positive and the negative external contact surface on the rear side. In so-called metal wrap through (MWT) solar cells, the solar cell front side, for example, is contacted through a passage contact opening from the rear side.

Different methods are known for producing a hole or a passage contact opening through a solar cell, which result in correspondingly different passage contact openings.

From "Die Metal Wrap Through Solarzelle—Entwicklung and Charakterisierung [The metal wrap through solar cell—development and characterization]", F. Clement, thesis, February 2009, a manufacturing process for a MWT single solar cell made of multi-crystalline silicon is known, wherein the passage contact openings are produced by means of a UV laser or an IR laser in an mc-Si substrate layer.

Only then is an emitter layer created by means of the phosphorus diffusion along the top surface, the side surfaces of the passage contact opening and the underside of the solar cell. The passage contact opening is filled with a conductive via paste, for example a silver paste, by means of screen printing.

With the laser, a very smooth side surface in the area of a passage opening can be achieved. Moreover, no undercuts occur in a laser ablation process. However, producing a hole through an existing p/n junction using laser ablation would lead to short circuits.

From "III-V multi-junction metal-wrap-through (MWT) concentrator solar cells", E. Oliva et al., Proceedings, $32^{nd}$ European PV Solar Energy Conference and Exhibition, Munich, 2016, pp. 1367-1371, an inverted grown GaInP/AlGaAs solar cell structure with passage contact openings is known, wherein the solar cell structure with the p/n junctions is epitaxially grown and only then are the passage contact openings produced by means of dry etching. A side surface of the passage opening is then coated with an insulating layer and the passage openings are then filled with galvanized copper.

U.S. Pat. No. 9,680,035 B1 discloses a solar cell stack of multiple III-V sub-cells on a GaAs substrate with a back-contacted front side, wherein a hole which extends from the top of the solar cell through the sub-cells up into a not-yet-thinned substrate layer is produced by means of a wet chemical etching process.

The etching process is based on the fact that the etching rates do not differ significantly, at least for the different III-V materials used in the solar cell stack. The hole is opened downward only by thinning the substrate layer. Passivation and metallization of the front side and the hole is carried out prior to thinning the substrate layer. The wet chemical etching has the advantage over corresponding dry etching processes that the side walls of the hole have a smoother surface and the passivation layer can be deposited conformally and without defects.

SUMMARY OF THE INVENTION

It is therefore an object of the present invention to provide a device which further develops the prior art.

According to an exemplary embodiment of the invention, a stacked multi-junction solar cell with a back-contacted front side is provided.

The multi-junction solar cell has a germanium substrate, which forms a rear side of the multi-junction solar cell, with a germanium sub-cell and at least two III-V sub-cells following one another in the named order.

Furthermore, the multi-junction cell has at least one passage contact opening that extends from the front side of the multi-junction solar cell through the sub-cells up to the rear side, and a metallic connection contact that is guided through the passage contact opening.

The passage contact opening has a contiguous side surface and an oval circumference in a cross section.

A diameter of the passage contact opening decreases in steps from the front side to the rear side of the multi-junction solar cell, wherein a first step that circumferentially projects into the passage contact opening is formed with a first tread depth in a projection, starting from the front side in the direction of the germanium sub-cell.

Furthermore, a second step having a second tread depth is formed, which projects into the passage contact opening from an area located below a p/n junction of the germanium sub-cell.

According to a further development, the multi-junction solar cell has exactly two passage contact openings.

The individual sub-cells of the multi-junction solar cell each can have a p/n junction and that the layers following the substrate are epitaxially generated on one another and/or connected to one another by means of wafer bonding.

In addition, a germanium sub-cell contains germanium or consists of germanium, wherein a layer consisting of germanium may possibly also contain further substances in addition to germanium, in particular dopants, but also impurities. The same also applies for the III-V sub-cells, which comprise one or more materials of main groups III and V or consist of such materials or such a combination of materials.

The diameter of the passage contact opening, which is greater in the area of the multi-junction solar cell, and the course of the passage contact opening tapering downward in a stepped manner does not have any underetching, thereby ensuring that a coating, such as an insulating layer, can be applied reliably and without defects in a simple manner, for example by means of vapor deposition.

In addition, the stepped passage opening can be produced in a simple manner, for example by means of a two-step etching process, which removes all p/n junctions without undercutting, and a subsequent laser ablation process, which enables the remaining Ge sub-cell and the Ge substrate to be cut in a quick and simple manner, even if the Ge substrate has not yet been or has not been particularly thinned.

The advantage of the multi-junction solar cell according to the invention is a particularly high level of reliability and efficiency with relatively low production costs.

The side surface of the passage contact opening can be coated with a dielectric insulating layer.

The metallic connection contact can be designed as a metallic contact layer extending on the dielectric insulating layer from the front side to the rear side of the multi-junction solar cell.

The III-V sub-cells can have a common layer thickness of 5-15 µm or 6-8 µm.

The passage contact opening can have a diameter of at least 300 µm or at least 400 µm or at least 450 µm on the front side of the multi-junction solar cell, wherein the diameter is not greater than 1 mm.

The side surface of the passage contact opening can have an angle, in each case with respect to a longitudinal axis of the passage contact opening, of at most 10° or at most 2° or at most 1° or at most 0.1° between the steps and/or above the first step and/or below the second step.

The first tread depth of the first step can be at least 100 µm or at least 200 µm.

The second tread depth of the second step can be at least 5 µm or at least 10 µm.

The germanium sub-cell, together with the germanium substrate, can have a layer thickness of 80-300 microns, or of 140-160 microns or of 80-120 microns.

A rise height from the second step to the first step can be 1-4 µm or 1-3 µm or 2 µm.

The multi-junction solar cell comprises a front side which forms the III-V cover layer, e.g., made of InGaP, with a thickness of 150-500 nm and a band gap of at least 1.86 eV.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
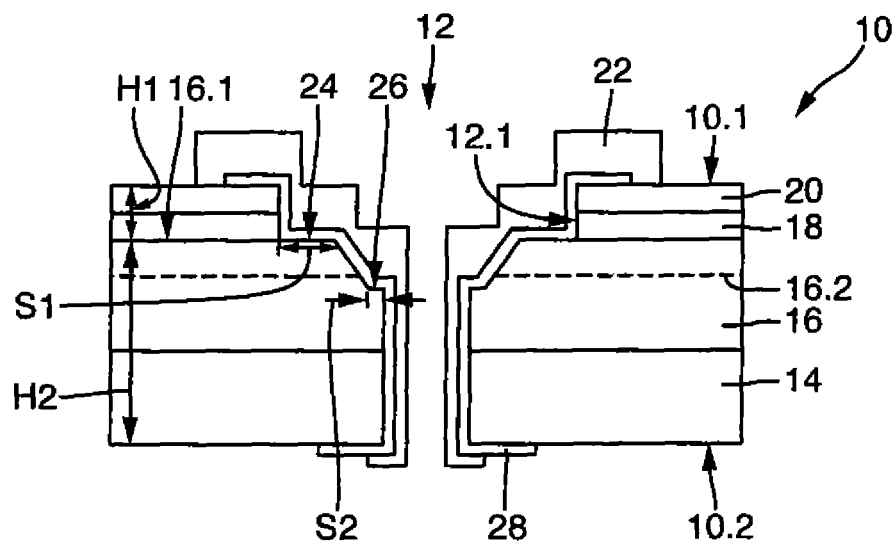
FIG. 1 is a cross section of an exemplary embodiment of a passage contact opening of a stacked multi-junction solar cell with a back-contacted front side.

The illustration in FIG. 1 shows a section of a stacked multi-junction solar cell 10 with a back-contacted front side in a cross section. The multi-junction solar cell has a top 10.1 and a bottom 10.2 and a passage opening 12 that extends from the top 10.1 to the bottom 10.2.

The bottom 10.2 is formed by a germanium substrate 14. On the germanium substrate there are, in the named order, a germanium sub-cell 16, a first III-V sub-cell 18 and a second III-V sub-cell 20 which forms the top 10.2.

Together, the two III-V sub-cells 18 and 20 have a first layer thickness H1. The germanium substrate 13, together with the germanium sub-cell, has a second layer thickness H2.

The passage opening 12 has a side surface 12.1, wherein the side surface 12.1 is formed to be contiguous as an outer surface of a cylinder and has an oval shape, for example circular or elliptical, in cross section.

The passage opening 12 also has two steps 24 and 26. The first step 24 is formed by a front side 16.1 of the germanium sub-cell 16, wherein the top 16.1 forms a circumferential tread surface with a tread depth S1 that is constant in the radial direction.

The second step 26 is located in an area of the germanium sub-cell 16 below a p/n junction 16.2 of the germanium sub-cell 16 and has a circumferential tread surface with a tread depth S2.

The side surface 12.1 of the passage contact opening 12 and an area of the top 10.1 and the bottom 10.2 that adjoins the passage opening 12 is covered with a dielectric insulating layer 28.

A metallic connection contact 22 is formed as a metallic contact layer, which extends from an area of the top 10.1 of the multi-junction solar cell 10 adjoining the dielectric insulating layer 28 on the dielectric insulating layer 28 through the passage contact opening to the area of the bottom 10.2 of the multi-junction solar cell that is covered by the dielectric insulating layer 28.

The metallic contact layer 22 is integrally bonded both with the top 10.1 of the multi-junction solar cell 10 and with the dielectric insulating layer 28.

Figure 2:
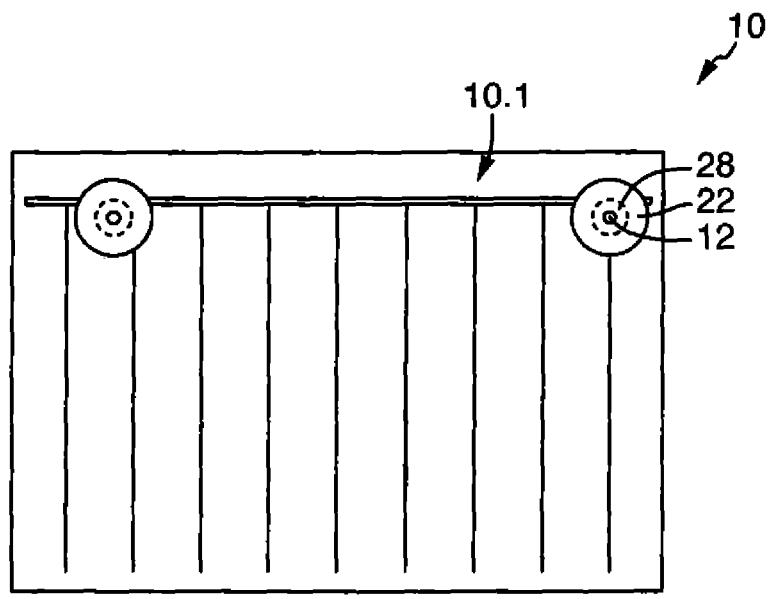
FIG. 2 is a plan view of an exemplary embodiment of the multi-junction solar cell.

In the illustration of FIG. 2, another embodiment of the multi-junction solar cell is shown in a plan view of the front side 10.1. Only what is different from the illustration in FIG. 1 is explained below.

The multi-junction solar cell 10 has exactly two passage contact openings 12, wherein the two passage contact openings 12 are each arranged at an end of a busbar and the metallic contact layers 22 are each electrically conductively connected to the contact rail.

In regular intervals, contact fingers extend perpendicularly to the busbar across the top 10.1 of the multi-junction solar cell, wherein each contact finger is electroconductively connected to the busbar and/or one of the contact layers 22.

Figure 3:
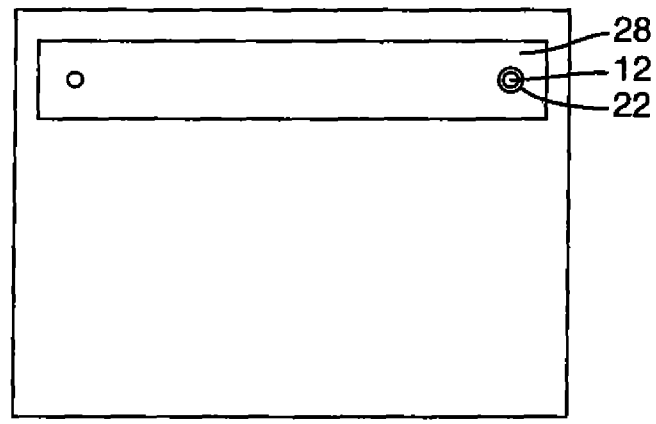
FIG. 3 is a rear side of an exemplary embodiment of the multi-junction solar cell.

In the illustration of FIG. 3, another embodiment of the multi-junction solar cell is shown in a plan view of the rear side 10.2. Only what is different to the illustration in FIG. 1 is explained below.

The multi-junction solar cell 10 has exactly two passage contact openings 12. The two passage contact openings are surrounded by a contiguous dielectric insulating layer 28.

Figure 4:
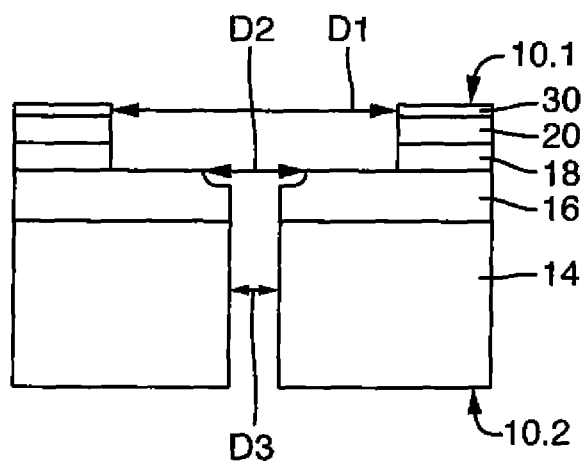
FIG. 4 is a cross section of an exemplary embodiment of the passage contact opening.

The illustration in FIG. 4 shows a cross section in the area of the passage opening of a further embodiment of the multi-junction solar cell, wherein only what is different from the illustration in FIG. 1 is explained.

The dielectric layer 28 and the metallic contact layer 22 are not shown for the sake of clarity.

The multi-junction solar cell 10 comprises a III-V cover layer 30, for example an InGaP layer, on the second III-V sub-cell 20, which forms the top 10.1 of the multi-junction solar cell 10.

The passage opening created by, for example, two etching processes and a laser ablation process has three areas that are in each case separated by one of the steps S1 or S2.

The first area extends from the top 10.1 of the multi-junction solar cell 10 to the top 16.2 of the germanium sub-cell, wherein the first area has a diameter D1 that is constant or only slightly decreases in the direction of the germanium sub-cell.

The second area extends from the top 16.1 of the germanium sub-cell 16 into the germanium sub-cell 16 and has a diameter D2 that is constant or decreases in the direction of the germanium substrate 14.

The third area extends from the second step S2 to the bottom 10.2 of the multi-junction solar cell and has a diameter D3 that is constant or slightly decreases in the direction of the bottom 10.2.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked multi-junction solar cell, comprising:
    a germanium substrate;
    a germanium sub-cell over the germanium substrate;
    at least two III-V sub-cells over the germanium sub-cell; and
    a passage contact opening that extends along a longitudinal direction from a front side of the multi-junction solar cell to a rear side of the multi-junction solar cell, through the at least two III-V sub-cells, the germanium sub-cell, and the germanium substrate, the passage contact opening having a contiguous side surface and an oval circumference in cross section, the front side being opposite the rear side,
    wherein the contiguous side surface of the passage contact opening includes a first step that circumferentially projects into the passage contact opening and has a first tread depth, and a second step that circumferentially projects into the passage contact opening and has a second tread depth, a tread of the second step is located below a p/n junction of the germanium sub-cell,
    wherein the passage contact opening has a first area from the front side to a tread of the first step, a second area from the tread of the first step to the tread of the second step, and a third area from the tread of the second step to the rear side,
    wherein a diameter of the passage contact opening in the first area is greater than a diameter of the passage contact opening in the second area, and the diameter of the passage contact opening in the second area is greater than a diameter of the passage contact opening in the third area, and
    wherein the stacked multi-junction solar cell further comprises:
        a dielectric insulating layer disposed on the contiguous side surface of the passage contact opening along side walls of the at least two III-V sub-cells, the germanium sub-cell, and the germanium substrate, the dielectric insulating layer extending from the front side of the multi-junction solar cell to the rear side of the multi-junction solar cell; and
        a metallic contact layer disposed on the dielectric insulating layer, the metallic contact layer extending from the front side of the multi-junction solar cell to the rear side of the multi-junction solar cell, physically contacting an upper surface of the at least two III-V sub-cells, and separated from the side walls by the dielectric insulating layer.

2. The stacked multi-junction solar cell according to claim 1, wherein the III-V sub-cells have a common layer thickness of 5-15 µm.

3. The stacked multi-junction solar cell according to claim 1, wherein a diameter of the passage contact opening on the front side of the multi-junction solar cell is at least 400 µm, and is not greater than 1 mm.

4. The stacked multi-junction solar cell according to claim 1, wherein between the steps and/or above the first step and/or below the second step, the side surface of the passage contact opening forms an angle of at most 10° with respect to a longitudinal axis of the passage contact opening.

5. The stacked multi-junction solar cell according to claim 1, wherein the first tread depth of the first step is at least 200 µm.

6. The stacked multi-junction solar cell according to claim 1, wherein the second tread depth of the second step is at least 10 µm.

7. The stacked multi-junction solar cell according to claim 1, wherein a thickness of the germanium sub-cell, together with the germanium substrate, is 140-160 µm or 80-120 µm.

8. The stacked multi-junction solar cell according to claim 1, wherein a distance from the second step to the first step along the longitudinal direction is 1-4 µm.

9. The stacked multi junction solar cell according to claim 1, wherein the multi-junction solar cell comprises a III-V cover layer that forms the front side and has a thickness of 150-500 nm and a band gap of at least 1.86 eV.

10. The stacked multi-junction solar cell according to claim 1, wherein a diameter of the passage contact opening decreases in steps from the front side to the rear side of the multi-junction solar cell.

11. The stacked multi-junction solar cell according to claim 1,
    wherein the passage contact opening on the front side of the multi-junction solar cell has a diameter of at least 300 µm,
    wherein a tread depth of the first step is at least 100 µm, and
    wherein a tread depth of the second step is at least 5 µm.

12. The stacked multi-junction solar cell according to claim 1, wherein the germanium sub-cell, together with the germanium substrate, has a layer thickness of 80-300 µm.

13. The stacked multi-junction solar cell according to claim 1,
    wherein the dielectric insulating layer is disposed directly on sidewalls of the at least two III-V sub-cells, the germanium sub-cell, and the germanium substrate, and
    wherein the metallic contact layer is disposed directly on the dielectric insulating layer.

14. The stacked multi-junction solar cell according to claim 1,
    wherein the diameter of the passage contact opening in the first area is constant or decreases in the longitudinal direction,
    wherein the diameter of the passage contact opening in the second area is constant or decreases in the longitudinal direction, and
    wherein the diameter of the passage contact opening in the third area is constant or decreases in the longitudinal direction.

15. The stacked multi-junction solar cell according to claim 2, wherein the III-V sub-cells have the common layer thickness of 6-8 µm.

16. The stacked multi-junction solar cell according to claim 3, wherein the diameter of the passage contact opening on the front side of the multi-junction solar cell is at least 450 µm.

17. The stacked multi-junction solar cell according to claim 4, wherein between the steps and/or above the first step and/or below the second step, the side surface of the passage contact opening forms the angle of at most 2° with respect to the longitudinal axis of the passage contact opening.

18. The stacked multi-junction solar cell according to claim 4, wherein between the steps and/or above the first step and/or below the second step, the side surface of the passage contact opening forms the angle of at most 1° with respect to the longitudinal axis of the passage contact opening.

19. The stacked multi-junction solar cell according to claim 8, wherein the distance from the second step to the first step along the longitudinal direction is 1-3 µm.

* * * * *